(12) United States Patent
Hou et al.

(10) Patent No.: US 10,969,643 B2
(45) Date of Patent: Apr. 6, 2021

(54) MASK AND MANUFACTURING METHOD THEREOF, AND LIGHT SHIELDING DEVICE AND CONTROL METHOD THEREOF

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Benxiang Hou, Beijing (CN); Zhiguang Guo, Beijing (CN); Xilei Yin, Beijing (CN); Xin Xiang, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

(*) Notice: Subject to any disclaimer, the term of this patent is extended or adjusted under 35 U.S.C. 154(b) by 424 days.

(21) Appl. No.: 15/776,039

(22) PCT Filed: Oct. 9, 2017

(86) PCT No.: PCT/CN2017/105383
§ 371 (c)(1),
(2) Date: May 14, 2018

(87) PCT Pub. No.: WO2018/161560
PCT Pub. Date: Sep. 13, 2018

(65) Prior Publication Data
US 2020/0285126 A1    Sep. 10, 2020

(30) Foreign Application Priority Data
Mar. 10, 2017 (CN) .......................... 201710142079.5

(51) Int. Cl.
*G02F 1/163* (2006.01)
*G02F 1/153* (2006.01)

(52) U.S. Cl.
CPC ............ *G02F 1/1533* (2013.01); *G02F 1/163* (2013.01); *G02F 2001/1635* (2013.01)

(58) Field of Classification Search
CPC ........ G02F 1/153; G02F 1/1533; G02F 1/163; G02F 2001/1635
See application file for complete search history.

(56) References Cited

U.S. PATENT DOCUMENTS 7,724,416 B2     5/2010  Miller
2007/0103612 A1* 5/2007  Lumpkin ............... G02F 1/1524
                                                            349/42

(Continued)

FOREIGN PATENT DOCUMENTS

CN     201867584 U     6/2011
CN     103235451 A     8/2013

(Continued)

OTHER PUBLICATIONS

Examiner provided machine translation of Guo et al. (CN103235451 A, of record) (Year: 2013).*

(Continued)

*Primary Examiner* — Balram T Parbadia
(74) *Attorney, Agent, or Firm* — McDermott Will & Emery LLP

(57) ABSTRACT

A mask includes a base substrate, control switches provided on the base substrate, and electrochromic film components provided on the base substrate. The control switches and the electrochromic film components are connected in one-to-one correspondence. The control switches are configured to, according to at least one light shielding region and a light transmitting region of the mask, control light transmittances (Continued)

of the electrochromic film components in one-to-one correspondence.

12 Claims, 4 Drawing Sheets

(56) References Cited

U.S. PATENT DOCUMENTS

2008/0238871 A1* 10/2008 Tam .................. G09G 3/38
  345/158
2008/0245975 A1* 10/2008 Miller ................ G03B 27/52
  250/492.22
2015/0160525 A1*  6/2015 Shi .................. G02F 1/133615
  359/275

FOREIGN PATENT DOCUMENTS

| CN | 103472648 A | 12/2013 |
| CN | 105116682 A | 12/2015 |
| CN | 106647090 A | 5/2017 |

OTHER PUBLICATIONS

International Search Report and Written Opinion issued in Internatonal Patent Application No. PCT/CN2017/105383, dated Jan. 12, 2018; with English translation.

* cited by examiner

US 10,969,643 B2

MASK AND MANUFACTURING METHOD THEREOF, AND LIGHT SHIELDING DEVICE AND CONTROL METHOD THEREOF

CROSS-REFERENCE TO RELATED APPLICATION

This application is a national phase entry under 35 USC 371 of International Patent Application No. PCT/CN2017/105383 filed on Oct. 9, 2017, which claims priority to Chinese Patent Application No. 201710142079.5, filed with Chinese Patent Office on Mar. 10, 2017 and titled "MASK AND MANUFACTURING METHOD THEREOF, LIGHT SHIELDING DEVICE AND CONTROL METHOD THEREOF", which are incorporated herein by reference in their entirety.

TECHNICAL FIELD

The present disclosure relates to the field of display technology, and more particularly, to a mask and a manufacturing method thereof, and a light shielding device and a control method thereof.

BACKGROUND

In the TFT-LCD (thin film transistor-liquid crystal display) industry, in a procedure of photolithography for a substrate or a procedure of sealant curing, it is necessary to use a mask to shield light and transmit light for the substrate. Taking the sealant curing as an example, as shown in FIG. 1, an ultraviolet light source 1 in an ultraviolet curing device emits ultraviolet light to irradiate a substrate 2. In order to prevent ultraviolet light from directly irradiating the liquid crystal in the substrate 2 and causing adverse reactions, a mask 3 for shielding the liquid crystal region of the substrate 2 is further provided between the ultraviolet light source 1 and the substrate 2. So that, only the sealant in periphery region of the substrate 2 other than the liquid crystal region is cured, so as to avoid adverse effects on the liquid crystal due to a direct irradiation of ultraviolet light.

In the prior art, substrates vary in pattern, so masks corresponding to the substrates with different patterns vary in light shielding region and light transmitting region, which causes the substrates with different patterns to require different corresponding masks. That is, a mask only can be applied to one type of substrates with a same pattern. Because the cost of producing a mask is very high and a production process is complicated, the cost of using the mask is high.

SUMMARY

The present disclosure adopts the following technical solutions.

A first aspect of the disclosure provides a mask. The mask includes a base substrate, control switches provided on the base substrate, and electrochromic film components provided on the base substrate. The control switches and the electrochromic film components are connected in one-to-one correspondence. The control switches are configured to, according to at least one light shielding region and a light transmitting region of the mask, control light transmittances of the electrochromic film components in one-to-one correspondence.

Optionally, the control switches are divided into M groups, each of which comprises N control switches, and the electrochromic film components are divided into M groups, each of which comprises N electrochromic film components, where M≥2 and N≥2.

Optionally, the control switches are arranged into a matrix on the base substrate, and the electrochromic film components are arranged into a matrix on the base substrate, wherein, the control switches are arranged into M rows and N columns, and the electrochromic film components are arranged into M rows and N columns; or, the control switches are arranged into N rows and M columns, and the electrochromic film components are arranged into N rows and M columns.

Optionally, an electrochromic substance in the electrochromic film components is an organic electrochromic substance and/or an inorganic electrochromic substance.

Optionally, the organic electrochromic substance is any one of polypyrrole, polythiophene, polyaniline or viologen, and the inorganic electrochromic substance is tungsten trioxide.

Optionally, the control switches are thin film transistors, a drain of one of the thin film transistors is connected with a corresponding one of the electrochromic film components.

A second aspect of the disclosure provides a manufacturing method of a mask. The manufacturing method of the mask includes: providing a base substrate; forming control switches on the base substrate; and forming electrochromic film components, which are connected with the control switches in one-to-one correspondence, on the base substrate.

Optionally, forming the control switches on the base substrate includes: forming M groups of control switches on the base substrate, each group including N control switches; and forming the electrochromic film components, which are connected with the control switches in one-to-one correspondence, on the base substrate, includes: forming M groups of electrochromic film components on the base substrate, each group comprising N electrochromic film components, where M≥2 and N≥2.

Optionally, the control switches are arranged into a matrix on the base substrate, and the electrochromic film components are arranged into a matrix on the base substrate, wherein the control switches are arranged into M rows and N columns, and the electrochromic film components are arranged into M rows and N columns; or the control switches are arranged into N rows and M columns, and the electrochromic film components are arranged into N rows and M columns.

A third aspect of the disclosure provides a light shielding device. The light shielding device includes: a mask according to the first aspect of the disclosure, a numerical control unit, a controller connected to the numerical control unit, a first driving circuit which is connected to the controller and control switches in the mask, and a second driving circuit which is connected to the controller and the control switches. The numerical control unit is configured to, according to a pattern of a substrate to which the mask corresponds, set at least one light shielding region and a light transmitting region in the mask. The controller is configured to, according to the at least one light shielding region and the light transmitting region which are set, generate and send a first control command to the first driving circuit, and generate and send a second control command to the second driving circuit. The first driving circuit is configured to, according to the first control command, provide a first driving voltage to at least part of the control switches in the mask corresponding to the at least one light shielding region and at least a part of the light transmitting region, and control the at least part of the control switches corresponding to the at least one light shielding region and the at least a part of the light transmitting region to be turned on. And the second driving circuit is configured to, according to the second control command, provide at least one second driving voltage to at least part of the control switches corresponding to the at least one light shielding region and at least a part of the light transmitting region in the mask, wherein the at least one second driving voltage is transmitted, through the at least part of the control switches, to corresponding electrochromic film components, to control the corresponding electrochromic film components to shield light or transmit light.

Optionally, the numerical control unit is further configured to, according to the pattern of the substrate to which the mask corresponds, set light transmittances of some of electrochromic film components in the mask corresponding to the light transmitting region. The second control command comprises information for controlling the light transmittances of the some of the electrochromic film components.

Optionally, in a case that the control switches are divided into M groups each of which comprises N control switches, the first driving circuit comprises M first driving signal output terminals, wherein an i-th first driving signal output terminal is connected to N control switches in an i-th group of the control switches, where i=1, . . . , M; and the second driving circuit comprises N second driving signal output terminals, wherein a j-th second driving signal output terminal is connected to a j-th control switch in each of the M groups of control switches, where j=1, . . . , N.

Optionally, in a case that the control switches are thin film transistors, the i-th first driving signal output terminal of the first driving circuit is connected to gates of N thin film transistors in the i-th group of thin film transistors, where i=1, . . . , M; and the j-th second driving signal output terminal of the second driving circuit is connected to a source of a j-th thin film transistor in each of the M groups of thin film transistors, where j=1, . . . , N.

A fourth aspect of the disclosure provides a control method of a light shielding device. The control method of the light shielding device is applied to the light shielding device according to the third aspect of the disclosure. The control method of the light shielding device includes: setting at least one light shielding region and a light transmitting region in a mask according to a pattern of a substrate to which the mask corresponds; generating and sending a first control command to a first driving circuit, and generating and sending a second control command to a second driving circuit, according to the at least one light shielding region and the light transmitting region which are set; providing, according to the first control command, a first driving voltage to at least part of control switches corresponding to the at least one light shielding region and at least a part of the light transmitting region in the mask, to control the at least part of the control switches corresponding to the at least one light shielding region and the at least a part of the light transmitting region to be turned on; and providing, according to the second control command, at least one second driving voltage to at least part of the control switches corresponding to the at least one light shielding region and at least a part of the light transmitting region in the mask, wherein the at least one second driving voltage is transmitted, through the at least part of the control switches, to corresponding electrochromic film components, to control the corresponding electrochromic film components to shield light or transmit light.

Optionally, in a case that one of the at least one second driving voltage U meets $U \geq U_0$, a corresponding electrochromic film component is controlled to shield light fully, where $U_0$ is a minimum driving voltage for controlling an electrochromic film component to shield light fully. And in a case that one of the at least one second driving voltage U meets $U \leq U_T$, a corresponding electrochromic film component is controlled to transmit light fully, wherein $U_T$ is a maximum driving voltage for controlling an electrochromic film component to transmit light fully.

Optionally, the control method of the light shielding device further includes: according to the pattern of the substrate to which the mask corresponds, setting light transmittances of some of electrochromic film components corresponding to at least a part of the light transmitting region in the mask, wherein the second control command comprises information for controlling the light transmittances of the some of the electrochromic film components; and in a case that one of the at least one second driving voltage U meets $U_T<U<U_0$, controlling a corresponding electrochromic film component to transmit light partly, where $U_0$ is a minimum driving voltage for controlling an electrochromic film component to shield light fully, and $U_T$ is a maximum driving voltage for controlling an electrochromic film component to transmit light fully.

BRIEF DESCRIPTION OF THE DRAWINGS

In order to describe technical solutions in embodiments of the present disclosure or in the prior art more clearly, the accompanying drawings to be used in description of embodiments or the prior art will be introduced briefly. Obviously, the accompanying drawings to be described below merely show some of the embodiments of the present disclosure, and a person of ordinary skill in the art can obtain other drawings according to those drawings without paying any creative effort.

DETAILED DESCRIPTION

In order to make the above objects, features and advantages of the present disclosure more comprehensible, the technical solutions in embodiments of the present disclosure will be described clearly and completely with reference to the accompanying drawings in embodiments of the present disclosure. Obviously, the described embodiments are merely some but not all of the embodiments of the present disclosure. All other embodiments, made on the basis of embodiments of the present disclosure by a person of ordinary skill in the art without paying any creative effort, shall be included in the protection scope of the present disclosure.

It should be noted that specific numbers of control switches and electrochromic film components shown in the accompanying drawings combined with the following embodiments are merely schematic illustrations and do not constitute limitations to their respective actual numbers.

The present disclosure provides a mask and a manufacturing method thereof, and a light shielding device and a control method thereof, which may solve the problem of narrow application range of the existing masks and may reduce the usage cost of the mask.

The mask provided in the present disclosure is additionally provided with control switches and electrochromic film components. Based on the characteristics that light transmission performances of the electrochromic film components are changeable under the function of an external electric field, and based on the structure that each electrochromic film component is able to be independently controlled by a corresponding control switch, different light shielding regions and different light transmitting regions are able to be formed in the mask by controlling the electrochromic film components to shield light or transmit light. Compared with the prior art, the mask provided in the present disclosure is able to have different settings of a light shielding region and a light transmitting region in the mask according to substrates with different patterns. Therefore, the mask provided in the present disclosure can be applied to the substrates with different patterns, having a wider application range than that in the prior art, and the usage cost thereof is reduced.

First Embodiment

Figure 1:
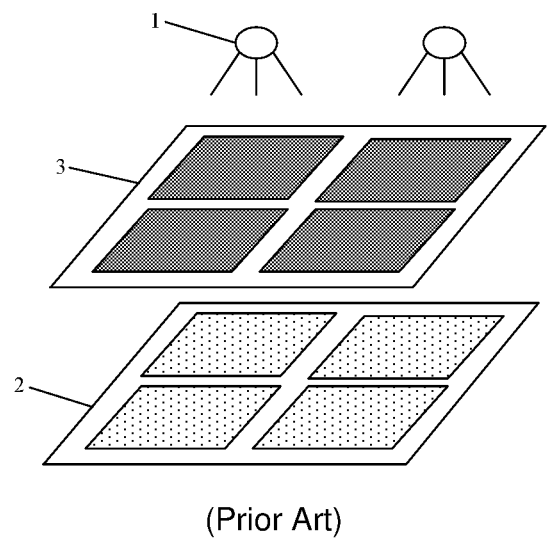
FIG. 1 is a diagram of curing a sealant using a mask in the prior art.
Figure 2:
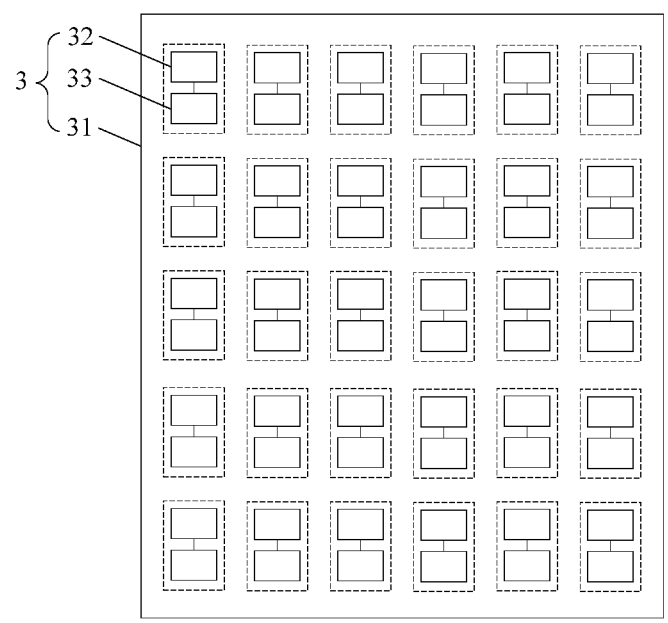
FIG. 2 is a structure diagram of a mask provided in a first embodiment of the present disclosure.

As shown in FIG. 2, this embodiment provides a mask 3, which includes a base substrate 31, control switches 32 disposed on the base substrate 31, and electrochromic film components 33 disposed on the base substrate 31. The control switches 32 and the electrochromic film components 33 are connected in one-to-one correspondence.

The control switches 32 are configured to, according to at least one light shielding region and a light transmitting region of the mask, control light transmittances of the electrochromic film components 33 in one-to-one correspondence.

Specifically, some of the control switches 32 corresponding to the at least one light shielding region of the mask are configured to respectively control some of the electrochromic film components 33 connected thereto to shield light. And some of the control switches 32 corresponding to the light transmitting region of the mask are configured to respectively control some of the electrochromic film components 33 connected thereto to transmit light.

The mask 3 provided in the present disclosure is additionally provided with the control switches 32 and the electrochromic film components 33. Based on the characteristics that the light transmission performances of the electrochromic film components 33 are changeable under the function of an external electric field, and based on the structure that each electrochromic device 33 is able to be independently controlled by a corresponding control switch 32, different light shielding regions and different light transmitting regions are able to be formed in the mask by controlling the electrochromic film components 33 to shield light or transmit light. Compared with the prior art, the mask 3 provided in this embodiment is able to have different settings of the light shielding region and the light transmitting region in the mask 3 according to substrates with different patterns. Therefore, the mask 3 provided in this embodiment can be applied to the substrates with different patterns, having a wider application range than that in the prior art, so that it is not necessary to provide each patterned substrate with a mask 3, and the usage cost of the mask 3 is reduced.

In addition, since the mask 3 provided in this embodiment can be applied to the substrates with different patterns, a series of problems in the prior art caused by frequent replacement of masks 3, is further avoided. Such frequent replacement of the masks 3 is caused by one patterned substrate being corresponding to one mask 3; and the series of problems are that, the masks 3 being damaged, cutting line manpower and cutting line time being increased, and large space being occupied to store the masks 3.

The arrangement of the control switches 32 and the electrochromic film components 33 on the base substrate 31 is able to be specifically set according to actual conditions. Optionally, the control switches 32 is able to be divided into M groups, and each group includes N control switches 32; and in correspondence, the electrochromic film components 33 is also able to be divided into M groups, and each group includes N electrochromic film components 33; where M≥2 and N≥2.

Optionally, the control switches 32 are able to be arranged into a matrix of M rows & N columns or N rows & M columns on the base substrate 31. Accordingly, in correspondence, the electrochromic film components 33 are also able to be arranged into a matrix of M rows & N columns or N rows & M columns on the base substrate 31.

By the regular matrix arrangements of the control switches 32 and the electrochromic film components 33, after the at least one light shielding region and the light transmitting region of the mask 3 are determined, the control switches 32 and the electrochromic film components 33 corresponding to the at least one light shielding region and those corresponding to the light transmitting region are able to be determined easily, so the electrochromic film components 33 are controlled more quickly and accurately.

For example, in cases that, in the mask 3, the control switches 32 and the electrochromic film components 33 in a first row and a second row correspond to the light shielding region, and the control switches 32 and the electrochromic film components 33 in a third row and a fourth row correspond to the light transmitting region, the control switches 32 in the first row and the second row are configured to control corresponding electrochromic film components 33 to shield light, and the control switches 32 in the third row and the fourth row are configured to control corresponding electrochromic film components 33 to transmit light.

Specifically, the electrochromic substance in the electrochromic film components 33 is an organic electrochromic substance and/or an inorganic electrochromic substance.

In cases that the electrochromic substance in the electrochromic film components 33 comprises the organic electrochromic substance, the organic electrochromic substance is able to be any one of polypyrrole, polythiophene, polyaniline or viologen. In cases that the electrochromic substance in the electrochromic film components 33 comprises the inorganic electrochromic substance, the inorganic electrochromic substance is able to be tungsten trioxide. Based on the characteristic that a reversible color change reaction is able to be taken place in the organic electrochromic substance and the inorganic electrochromic substance, it achieves that the light transmission properties of the electrochromic film components 33 change.

Optionally, the control switches 32 is specifically able to be thin film transistors, and a drain of one of the thin film transistors is connected to a corresponding electrochromic film component 33.

Second Embodiment

This embodiment provides a manufacturing method of a mask. The manufacturing method of the mask corresponds to the mask provided in the first embodiment.

Figure 3:
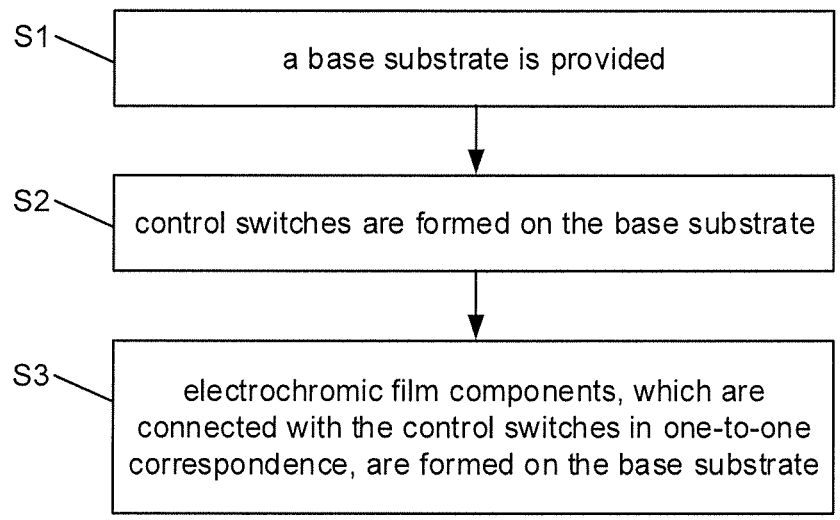
FIG. 3 is a flowchart of a manufacturing method of a mask provided in a second embodiment of the present disclosure.

As shown in FIG. 3, the manufacturing method of the mask specifically includes:

step S1, a base substrate is provided;

step S2, control switches are formed on the base substrate; and step S3, electrochromic film components, which are connected with the control switches in one-to-one correspondence, are formed on the base substrate.

The mask produced by this manufacturing method, is additionally provided with the control switches and the electrochromic film components on the base substrate. Based on the characteristics that light transmission performances of the electrochromic film components are changeable under the function of an external electric field, and based on the structure that each electrochromic film component is able to be independently controlled by a corresponding control switch, different light shielding regions and different light transmitting regions are able to be formed in the mask by controlling the electrochromic film components to shield light or transmit light. Therefore, with the manufacturing method of the mask provided in this embodiment, it is able to produce the mask applied to substrates with different patterns, and an application range of this mask is wider than that of the mask in the prior art.

Optionally, the step S2 that the control switches are formed on the base substrate is specifically able to include: M groups of control switches are formed on the base substrate, and each group includes N control switches. Correspondingly, the step S3 that the electrochromic film components, which are connected with the control switches in one-to-one correspondence, are formed on the base substrate, is specifically able to include: M groups of electrochromic film components are formed on the base substrate, and each group includes N electrochromic film components, where M≥2 and N≥2.

Optionally, the control switches are able to be arranged into a matrix of M rows & N columns or N rows & M columns on the base substrate. Correspondingly, the electrochromic film components are also arranged into a matrix on the base substrate, wherein the electrochromic film components are also arranged into a matrix of M rows & N columns or N rows & M columns.

By the regular matrix arrangements of the control switches and the electrochromic film components, after at least one light shielding region and a light transmitting region of the mask are determined, which control switches and which electrochromic film components corresponding to the light shielding region and those corresponding to the light transmitting region are able to be easily determined, so the electrochromic film components are controlled more quickly and accurately.

Specifically, the electrochromic film components are able to be formed with an organic electrochromic substance such as any one of polypyrrole, polythiophene, polyaniline, violo- gen or the like, and/or an inorganic electrochromic substance such as tungsten trioxide or the like.

The control switches which are formed, are able to be thin film transistors, and a drain of one thin film transistor is connected to one electrochromic film component.

Third Embodiment

Figure 4:
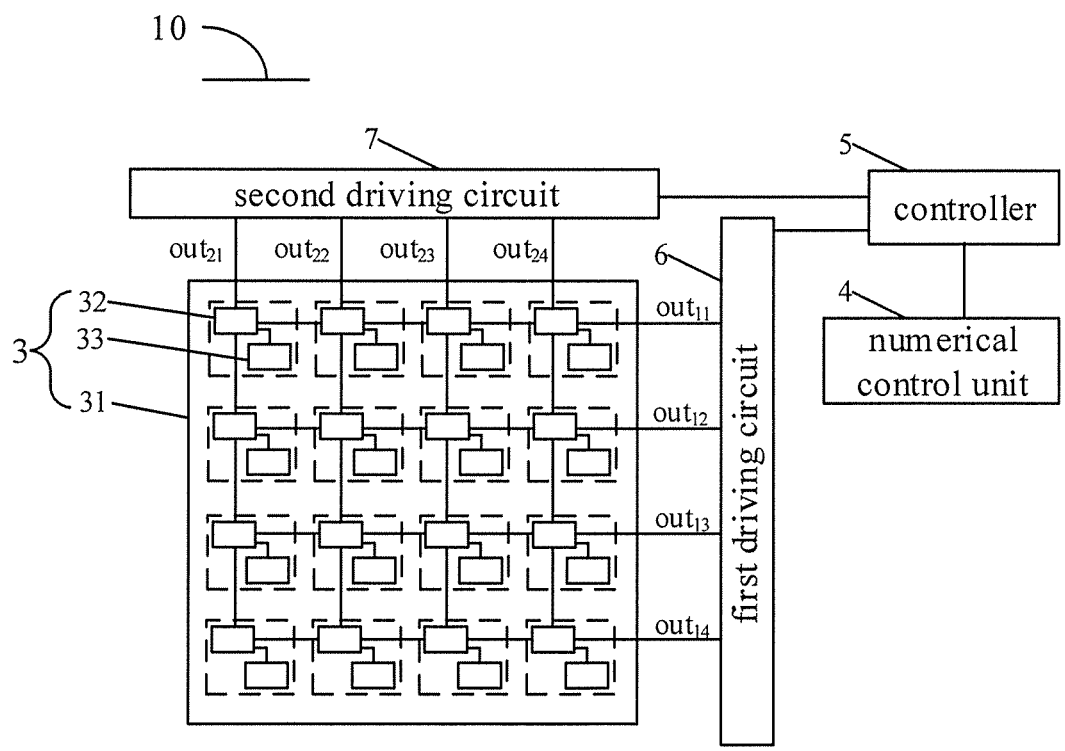
FIG. 4 is a structure diagram of a light shielding device provided in a third embodiment of the present disclosure.

As shown in FIG. 4, this embodiment provides a light shielding device 10, which includes the mask 3 described in the first embodiment, a numerical control unit 4, a controller 5, a first driving circuit 6 and a second driving circuit 7. Here, the numerical control unit 4 is connected with the controller 5, the first driving circuit 6 is connected with the controller 5 and the control switches 32 in the mask 3, and the second driving circuit 7 is also connected with the controller 5 and the control switches 32 in the mask 3.

Specifically, the numerical control unit 4 is configured to, according to a pattern of a substrate 2 to which the mask 3 corresponds, set at least one light shielding region and a light transmitting region in the mask 3.

The controller 5 is configured to, according to the light shielding region and the light transmitting region which are set, generate and send a first control command to the first driving circuit 6, and generate and send a second control command to the second driving circuit 7.

The first driving circuit 6 is configured to, according to the first control command, provide a first driving voltage to at least part of the control switches 32 in the mask 3 corresponding to the light shielding region and at least a part of the light transmitting region, and control the corresponding at least part of the control switches 32 to be turned on.

The second driving circuit 7 is configured to, according to the second control command, provide at least one second driving voltage to at least part of the control switches 32 in the mask 3 corresponding to the light shielding region and at least a part of the light transmitting region, and the at least one second driving voltage is transmitted, through the at least part of the control switches, to corresponding electrochromic film components 33 to control the corresponding electrochromic film components 33 to shield light or transmit light.

Since the light shielding device 10 provided in this embodiment includes the mask 3 provided in the first embodiment, with the light shielding device 10 provided in this embodiment, there are able to be different settings of the light shielding region and the light transmitting region of the mask 3 according to substrates with different patterns, i.e., there is a wider application range.

It should be noted that, in cases that light is transmitted to a light-entering region of the substrate through the light transmitting region in the mask 3, it is also able to transmit the light non-fully. The light transmittance is able to be limited specifically according to actual process conditions. Based on this, the numerical control unit 4 is further configured to, according to the pattern of the substrate to which the mask 3 corresponds, set the light transmittances of some of the electrochromic film components in the mask 3 corresponding to the light transmitting region. Correspondingly, the second control command sent by the controller 5 to the second driving circuit 7 includes information for controlling the light transmittances of the some of the electrochromic film components 33.

Optionally, with continued reference to FIG. 4, in cases that the control switches are divided into M groups and each group includes N control switches, the first driving circuit 6 includes M first driving signal output terminals (out$_{11}$- out$_{1M}$), and an i-th first driving signal output is connected to N control switches in an i-th group of the control switches, where i=1, . . . , M. The second driving circuit 7 includes N second driving signal output terminals (out$_{21}$-out$_{2N}$), and a j-th second driving signal output terminal is connected to a j-th control switch in each group of the control switches, where j=1, . . . , N.

Specifically, in cases that the control switches are thin film transistors, the i-th first driving signal output terminal of the first driving circuit 6 is connected to gates of N thin film transistors in the i-th group of thin film transistors, where i=1, . . . , M. The j-th second driving signal output terminal of the second driving circuit 7 is connected to a source of a j-th thin film transistor in each group of thin film transistors, where j=1, . . . , N.

Based on the specific connection mode of the thin film transistors, the first driving circuit 6 provides a turn-on voltage to the gates of at least part of the thin film transistors, and controls the at least part of the thin film transistors corresponding to the at least one light shielding region and the at least a part of the light transmitting region to be turned on. After the at least part of the thin film transistors are turned on, the at least one second driving voltage provided by the second driving circuit 7 is able to be transmitted, through at least part of the thin film transistors, to corresponding electrochromic film components 33. By controlling the magnitude of the second driving voltage, electrochromic film components corresponding to the light shielding region are controlled to shield light, and electrochromic film components 33 corresponding to the light transmitting region are controlled to transmit light.

Figure 5:
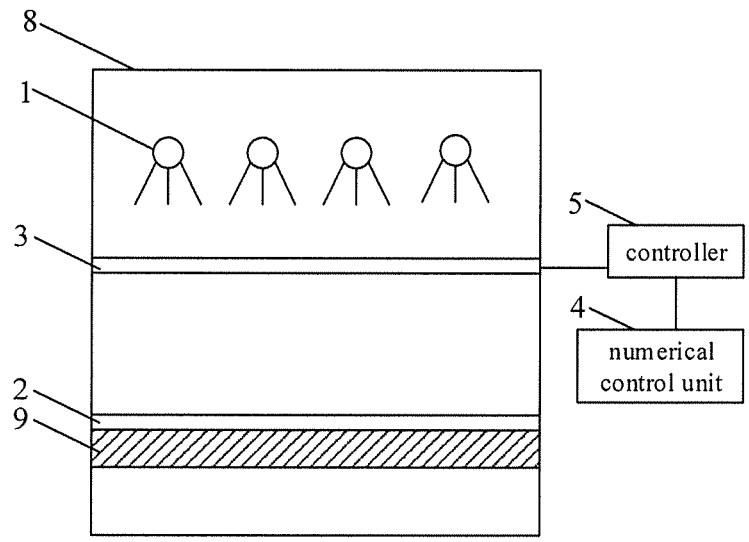
FIG. 5 is a diagram of curing a sealant using a light shielding device provided in a third embodiment of the present disclosure.

It should be noted that the light shielding device 10 provided in this embodiment is able to be applied in a photolithography process, and is also able to be applied in a sealant curing process. The application of the light shielding device 10 in the sealant curing process will be described in detail as follows in combination with the light shielding device 10 shown in FIG. 4 and an ultraviolet curing device shown in FIG. 5 (the first driving circuit 6 and the second driving circuit 7 are not shown in FIG. 5), wherein the ultraviolet curing device specifically includes an ultraviolet light source 1, a body structure 8 and a working base 9.

First, the numerical control unit 4 sets the light shielding region in the mask 3 according to the liquid crystal region of the substrate 2 to which the mask 3 corresponds, and sets the light transmitting region in the mask 3 according to the peripheral region, which is except the liquid crystal region, of the substrate 2. Then, according to the light shielding region and the light transmitting region which are set, the controller 5 generates and sends the first control command to the first driving circuit 6, and generates and sends the second control command to the second driving circuit 7. Then, according to the first control command, the first driving circuit 6 provides the first driving voltage to at least part of the control switches 32 corresponding to the light shielding region and at least a part of the light transmitting region in the mask 3 and controls the corresponding at least part of the control switches 32 to be turned on. Finally, according to the second control command, the second driving circuit 7 provides the at least one second driving voltage to at least part of the control switches 32 corresponding to the light shielding region and at least a part of the light transmitting region in the mask 3. The at least one second driving voltage is transmitted, through the at least part of the control switches 32, to corresponding electrochromic film components 33 to control the corresponding electrochromic film components 33 to shield light or transmit light.

In cases that ultraviolet light is emitted from the ultraviolet light source 1 in the ultraviolet curing device, the liquid crystal region in the substrate 2 is shielded by the light shielding region of the mask 3, so the ultraviolet light is not able to directly irradiate the liquid crystal in the substrate 2, while the periphery region in the substrate 2 corresponds to the light transmitting region of the mask 3, so the ultraviolet light is able to irradiate the peripheral region of the substrate 2 through the light transmitting region of the mask 3, thereby curing the sealant in the periphery region of the substrate 2. So that, it can ensure that the liquid crystal in the substrate 2 is not affected by the ultraviolet light, thereby ensuring the performance of the substrate 2. In addition, with the light shielding device 10 provided in this embodiment, there are different settings of the light shielding region and the light transmitting region of the mask according to the substrates with different patterns, so that the mask has a wider application range.

Fourth Embodiment

This embodiment provides a control method of a light shielding device. The control method of the light shielding device is applied to the light shielding device as described in the third embodiment.

Figure 6:
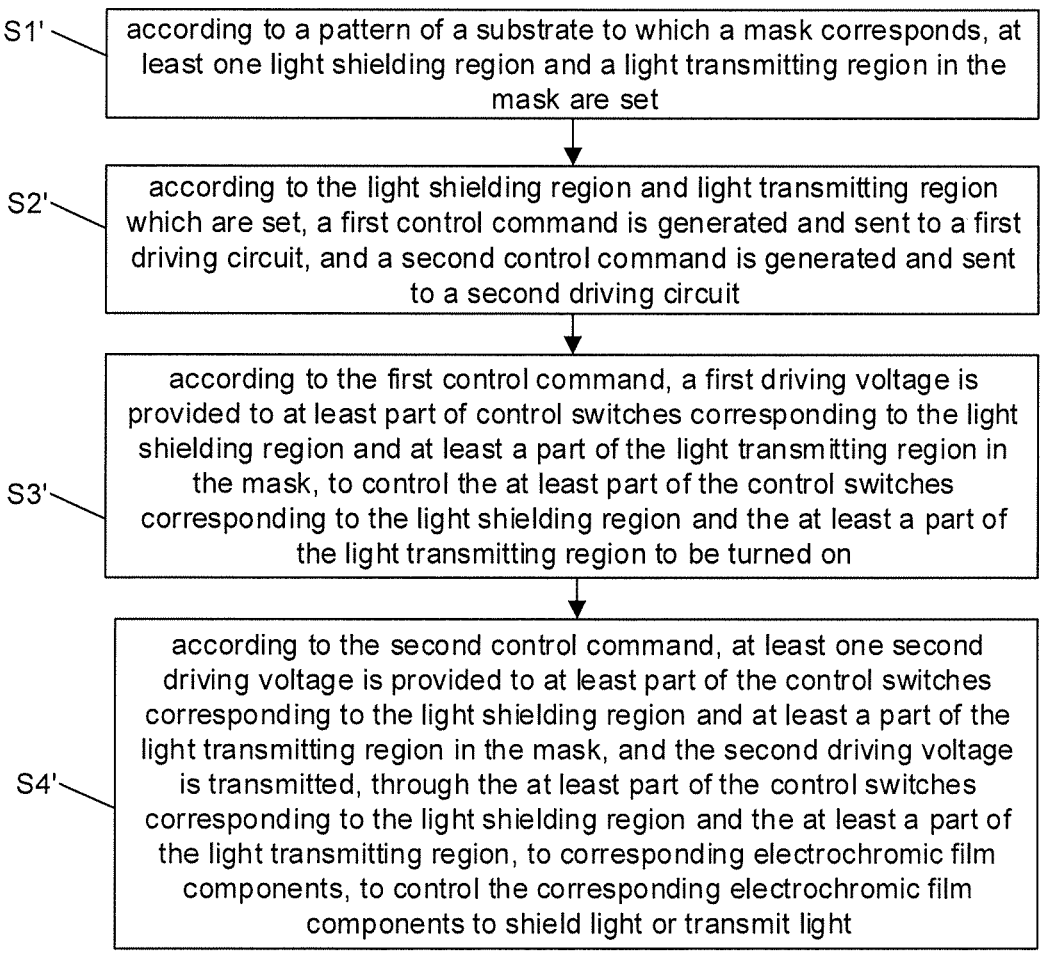
FIG. 6 is a flowchart of a control method of a light shielding device provided in a fourth embodiment of the present disclosure.

As shown in FIG. 6, the control method of the light shielding device specifically includes:

step S1', according to a pattern of a substrate to which a mask corresponds, at least one light shielding region and a light transmitting region in the mask are set;

step S2', according to the light shielding region and light transmitting region which are set, a first control command is generated and sent to a first driving circuit, and a second control command is generated and sent to a second driving circuit;

step S3', according to the first control command, a first driving voltage is provided to at least part of control switches corresponding to the light shielding region and at least a part of the light transmitting region in the mask, to control the at least part of the control switches corresponding to the light shielding region and the at least a part of the light transmitting region to be turned on; and step S4', according to the second control command, at least one second driving voltage is provided to at least part of the control switches corresponding to the light shielding region and at least a part of the light transmitting region in the mask, and the second driving voltage is transmitted, through the at least part of the control switches corresponding to the light shielding region and the at least a part of the light transmitting region, to corresponding electrochromic film components, to control the corresponding electrochromic film components to shield light or transmit light.

In the control method of the light shielding device provided in this embodiment, after the first driving circuit provides the first driving voltage, at least part of the control switches are turned on. After the at least part of the control switches are turned on, the at least one second driving voltage provided by the second driving circuit is transmitted, through the at least part of the control switches, to corresponding electrochromic film components, to control the corresponding electrochromic film components to shield light or transmit light. By controlling the electrochromic film components to shield light or transmit light, different light shielding regions and different light transmitting regions are set for the mask in the light shielding device, so that the light shielding device can correspond to substrates with different patterns.

It should be noted that, before the light shielding device is controlled, a functional fitting relationship between the light transmittance of one electrochromic film component in the light shielding device and the second driving voltage needs to be tested in advance.

Figure 7:
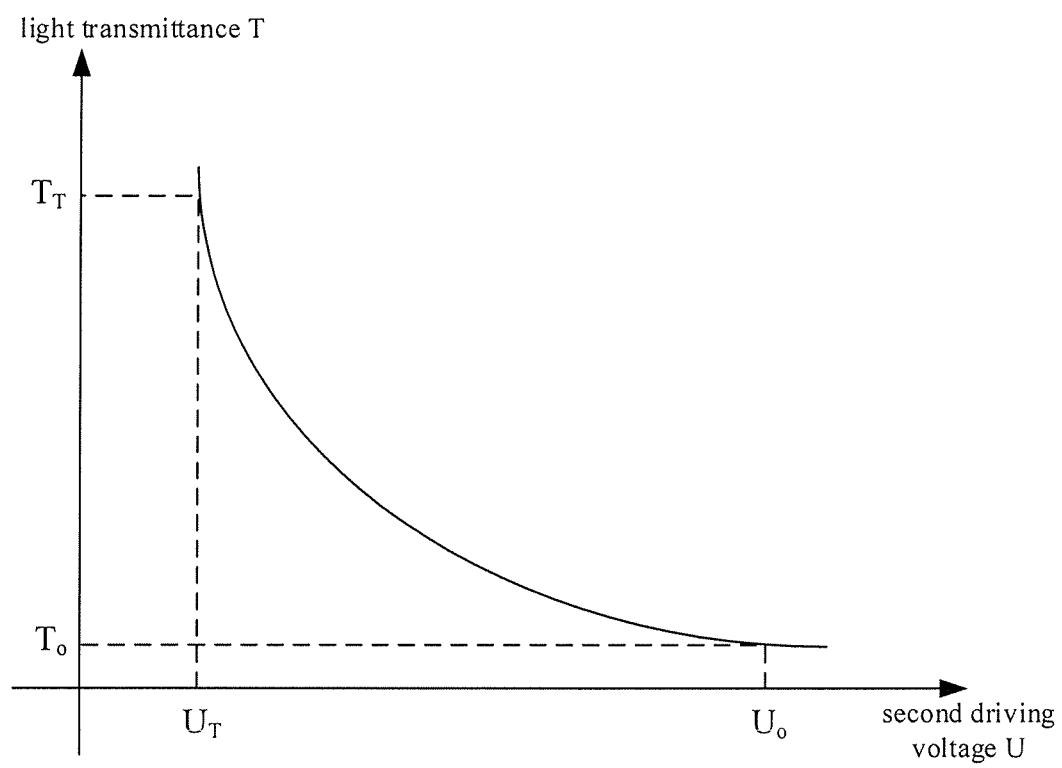
FIG. 7 is a diagram of a functional fitting relationship, between a light transmittance of an electrochromic film component and a second driving voltage, provided in a fourth embodiment of the present disclosure.

Take the functional fitting relationship shown in FIG. 7 as an example. According to the test results, the light transmittance of an electrochromic film component is minimized, in cases that one of the at least one second driving voltage meets $U=U_0$; and the light transmittance of an electrochromic film component is maximized, in cases that one of the at least one second driving voltage meets $U=U_T$. That is, in cases that one of the at least one second driving voltage U meets $U \geq U_0$, a corresponding electrochromic film component is controlled to shield light fully; and in cases that one of the at least one second driving voltage U meets $U \leq U_T$, a corresponding electrochromic film component is controlled to transmit light fully. $U_0$ is able to be defined as a minimum driving voltage for controlling an electrochromic film component to shield light fully; and $U_T$ is able to be defined as a maximum driving voltage for controlling an electrochromic film component to transmit light fully.

It should be noted that, in cases that light is transmitted, through the light transmitting region in the mask, to a light-entering region in the substrate, the light is able to be transmitted non-fully. The light transmittance is able to be limited specifically according to actual process conditions. Based on this, the control method of the light shielding device further includes: according to the pattern of the substrate to which the mask corresponds, light transmittances of some of the electrochromic film components corresponding to at least a part of the light transmitting region in the mask are set, wherein the second control command includes information for controlling the light transmittances of the some of the electrochromic film components.

According to FIG. 7, it can be seen that different values of the second driving voltage correspond to different light transmittances of an electrochromic film component. In cases that the second driving circuit receives the second control command including the information for controlling a light transmittance of one electrochromic film component according to a required light transmittance, the second driving circuit provides a second driving voltage corresponding to the light transmittance, to control the corresponding electrochromic film component to transmit light partly.

Taking again the functional fitting relationship as shown in FIG. 7 as an example, in cases that one of the at least one second driving voltage U provided by the second driving circuit is controlled to meet $U_T<U<U_0$, a corresponding electrochromic film component is able to be controlled to transmit light partly.

The foregoing descriptions are merely specific implementations of the present disclosure, but the protection scope of the present disclosure is not limited thereto. Any person skilled in the art can easily conceive of variations or replacements within the technical scope disclosed in the present disclosure, and these variations or replacements shall fall into the scope of the disclosure. Therefore, the protection scope of the present disclosure shall be subject to the protection scope of the claims.

What is claimed is:

1. A light shielding device, comprising a mask, a numerical control unit, a controller connected to the numerical control unit, a first driving circuit which is connected to the controller and control switches in the mask, and a second driving circuit which is connected to the controller and the control switches, wherein the mask comprises a base substrate, control switches provided on the base substrate, and electrochromic film components provided on the base substrate, wherein the control switches and the electrochromic film components are connected in one-to-one correspondence, and the control switches are configured to, according to at least one light shielding region and a light transmitting region of the mask, control light transmittances of the electrochromic film components in one-to-one correspondence;

the numerical control unit is configured to, according to a pattern of a substrate to which the mask corresponds, set at least one light shielding region and a light transmitting region in the mask;

the controller is configured to, according to the at least one light shielding region and the light transmitting region which are set, generate and send a first control command to the first driving circuit, and generate and send a second control command to the second driving circuit;

the first driving circuit is configured to, according to the first control command, provide a first driving voltage to at least part of the control switches in the mask corresponding to the at least one light shielding region and at least a part of the light transmitting region, and control the at least part of the control switches corresponding to the at least one light shielding region and the at least a part of the light transmitting region to be turned on; and the second driving circuit is configured to, according to the second control command, provide at least one second driving voltage to at least part of the control switches corresponding to the at least one light shielding region and at least a part of the light transmitting region in the mask, wherein the at least one second driving voltage is transmitted, through the at least part of the control switches, to corresponding electrochromic film components to control the corresponding electrochromic film components to shield light or transmit light.

2. The light shielding device according to claim 1, wherein the control switches are divided into M groups, each of which comprises N control switches, and the electrochromic film components are divided into M groups, each of which comprises N electrochromic film components, where $M \geq 2$ and $N \geq 2$.

3. The light shielding device according to claim 2, wherein the control switches are arranged into a matrix on the base substrate, and the electrochromic film components are arranged into a matrix on the base substrate, wherein the control switches are arranged into M rows and N columns, and the electrochromic film components are arranged into M rows and N columns; or the control switches are arranged into N rows and M columns, and the electrochromic film components are arranged into N rows and M columns.

4. The light shielding device according to claim 1, wherein an electrochromic substance in the electrochromic film components is an organic electrochromic substance and/or an inorganic electrochromic substance.

5. The light shielding device according to claim 4, wherein the organic electrochromic substance is any one of polypyrrole, polythiophene, polyaniline or viologen, and the inorganic electrochromic substance is tungsten trioxide.

6. The light shielding device according to claim 1, wherein the control switches are thin film transistors, a drain of one of the thin film transistors is connected with a corresponding one of the electrochromic film components.

7. The light shielding device according to claim 1, wherein the numerical control unit is further configured to, according to the pattern of the substrate to which the mask corresponds, set light transmittances of some of electrochromic film components in the mask corresponding to the light transmitting region; and
the second control command comprises information for controlling the light transmittances of the some of the electrochromic film components.

8. The light shielding device according to claim 1, wherein in a case that the control switches are divided into M groups each of which comprises N control switches, the first driving circuit comprises M first driving signal output terminals, wherein an i-th first driving signal output terminal is connected to N control switches in an i-th group of the control switches, where i=1, . . . , M; and
the second driving circuit comprises N second driving signal output terminals, wherein a j-th second driving signal output terminal is connected to a j-th control switch in each of the M groups of control switches, where j=1, . . . , N.

9. The light shielding device according to claim 8, wherein in a case that the control switches are thin film transistors,
the i-th first driving signal output terminal of the first driving circuit is connected to gates of N thin film transistors in the i-th group of thin film transistors, where i=1, . . . , M; and
the j-th second driving signal output terminal of the second driving circuit is connected to a source of a j-th thin film transistor in each of the M groups of thin film transistors, where j=1, . . . , N.

10. A control method of a light shielding device, wherein the control method of the light shielding device is applied to the light shielding device according to claim 1, and the control method of the light shielding device comprises:
setting at least one light shielding region and a light transmitting region in a mask according to a pattern of a substrate to which the mask corresponds;
generating and sending a first control command to a first driving circuit, and generating and sending a second control command to a second driving circuit, according to the at least one light shielding region and the light transmitting region which are set;
providing, according to the first control command, a first driving voltage to at least part of control switches corresponding to the at least one light shielding region and at least a part of the light transmitting region in the mask, to control the at least part of the control switches corresponding to the at least one light shielding region and the at least a part of the light transmitting region to be turned on; and
providing, according to the second control command, at least one second driving voltage to at least part of the control switches corresponding to the at least one light shielding region and at least a part of the light transmitting region in the mask, wherein the at least one second driving voltage is transmitted, through the at least part of the control switches, to corresponding electrochromic film components, to control the corresponding electrochromic film components to shield light or transmit light.

11. The control method of the light shielding device according to claim 10, further comprising:
in a case that one of the at least one second driving voltage U meets $U \geq U_0$, controlling a corresponding electrochromic film component to shield light fully, where $U_0$ is a minimum driving voltage for controlling an electrochromic film component to shield light fully; and
in a case that one of the at least one second driving voltage U meets $U \leq U_T$, controlling a corresponding electrochromic film component to transmit light fully, where $U_T$ is a maximum driving voltage for controlling an electrochromic film component to transmit light fully.

12. The control method of the light shielding device according to claim 10, wherein the control method of the light shielding device further comprises: according to the pattern of the substrate to which the mask corresponds, setting light transmittances of some of electrochromic film components corresponding to at least a part of the light transmitting region in the mask, wherein the second control command comprises information for controlling the light transmittances of the some of the electrochromic film components; and
in a case that one of the at least one second driving voltage U meets $U_T<U<U_0$, controlling a corresponding electrochromic film component to transmit light partly, where $U_0$ is a minimum driving voltage for controlling an electrochromic film component to shield light fully, and $U_T$ is a maximum driving voltage for controlling an electrochromic film component to transmit light fully.

* * * * *